United States Patent
Saggio et al.

(10) Patent No.: US 8,901,652 B2
(45) Date of Patent: Dec. 2, 2014

(54) POWER MOSFET COMPRISING A PLURALITY OF COLUMNAR STRUCTURES DEFINING THE CHARGE BALANCING REGION

(75) Inventors: Mario Giuseppe Saggio, Aci Castello (IT); Alfio Guarnera, Trecastagni (IT); Simone Rascuna', Catania (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 432 days.

(21) Appl. No.: 12/862,976

(22) Filed: Aug. 25, 2010

(65) Prior Publication Data
US 2011/0049616 A1  Mar. 3, 2011

(30) Foreign Application Priority Data
Sep. 1, 2009  (IT) .............. MI2009A1520

(51) Int. Cl.
  *H01L 29/78*  (2006.01)
(52) U.S. Cl.
  USPC ............... 257/341; 401/492; 401/E29.275
(58) Field of Classification Search
  USPC .......... 257/328, 335–342, 492, 493, E29.027, 257/E29.028, E29.066, E29.067, E29.256, 257/E29.257, E29.259, E29.26
  See application file for complete search history.

(56) References Cited

U.S. PATENT DOCUMENTS

| | | | |
|---|---|---|---|
| 6,228,719 B1 | 5/2001 | Frisina et al. | |
| 6,300,171 B1 | 10/2001 | Frisina | |
| 6,404,010 B2 | 6/2002 | Saggio et al. | |
| 6,498,368 B2 * | 12/2002 | Sakamoto et al. | 257/341 |
| 6,586,798 B1 | 7/2003 | Frisina | |
| 6,614,090 B2 * | 9/2003 | Deboy et al. | 257/493 |
| 7,498,619 B2 | 3/2009 | Saggio et al. | |
| 7,576,393 B2 * | 8/2009 | Ono et al. | 257/341 |
| 7,851,897 B1 * | 12/2010 | Cate et al. | 257/678 |
| 2002/0074567 A1 | 6/2002 | Deboy et al. | |

FOREIGN PATENT DOCUMENTS

| | | |
|---|---|---|
| EP | 1111685 | 6/2001 |
| EP | 1911075 | 4/2008 |
| WO | 2007006505 | 1/2007 |

OTHER PUBLICATIONS

Search Report based on Italian Application No. MI20091520, Ministero dello Sviluppo Economico, Munich, May 19, 2010, pp. 2.

* cited by examiner

*Primary Examiner* — Marcos D. Pizarro
(74) *Attorney, Agent, or Firm* — Allen, Dyer, Doppelt, Milbrath & Gilchrist, P.A.

(57) ABSTRACT

An embodiment of a semiconductor structure for a power device integrated on a semiconductor substrate, of a first type of conductivity, and comprising:—an epitaxial layer, of said first type of conductivity, made on said semiconductor substrate, and having a plurality of column structures, of a second type of conductivity, to define a charge balancing region;—an active surface layer made on said epitaxial layer for housing a plurality of active regions; said epitaxial layer comprising a semiconductor separating layer arranged between the charge balancing region and the active surface layer, said semiconductor separating layer decoupling said column structures from said active regions.

32 Claims, 7 Drawing Sheets

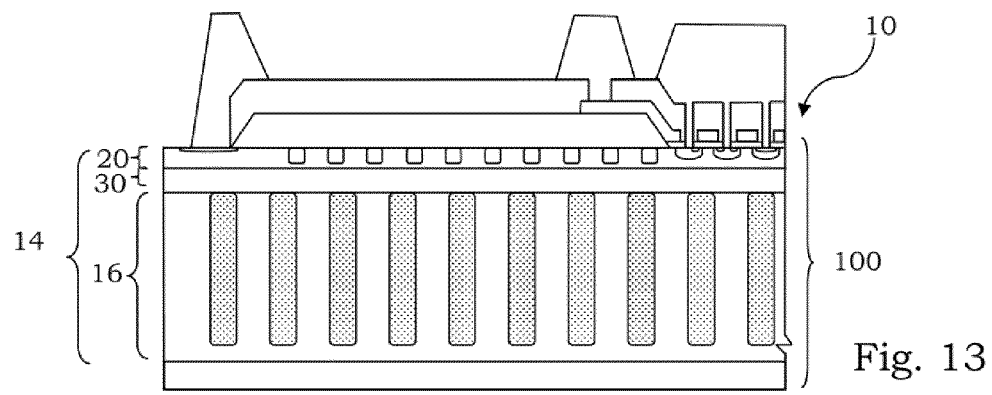
Fig. 13
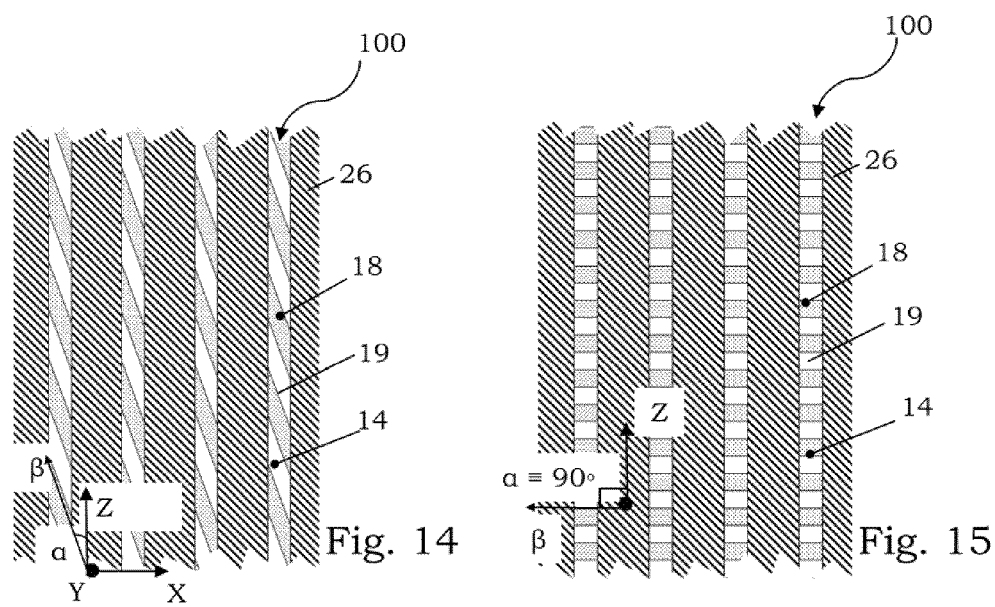
Fig. 14
Fig. 15
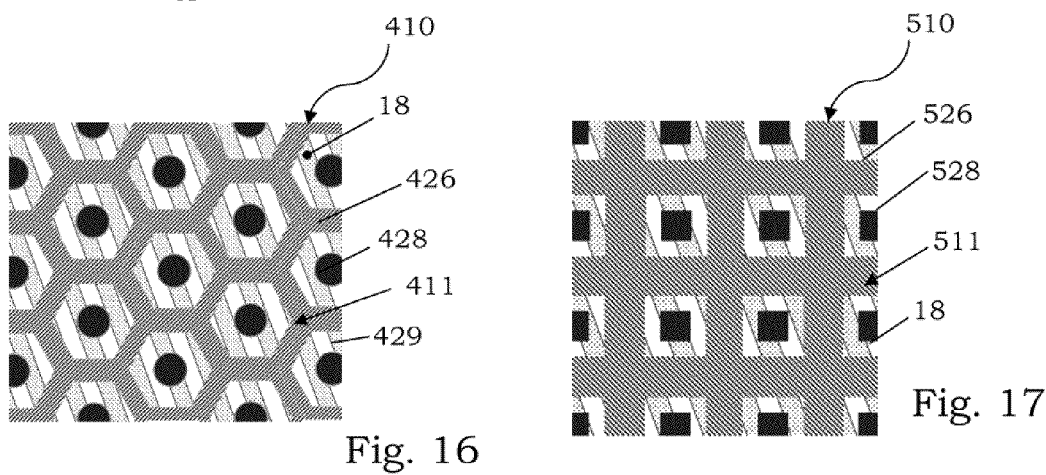
Fig. 16
Fig. 17

POWER MOSFET COMPRISING A PLURALITY OF COLUMNAR STRUCTURES DEFINING THE CHARGE BALANCING REGION

PRIORITY CLAIM

The instant application claims priority to Italian Patent Application No. MI2009A001520, filed Sep. 1, 2009, which application is incorporated herein by reference in its entirety.

TECHNICAL FIELD

An embodiment of the present invention discloses a semiconductor structure for a power device.

More specifically, an embodiment of the invention discloses a semiconductor structure for a power device integrated on a semiconductor substrate, of a first type of conductivity, and comprising an epitaxial layer of the first type of conductivity made on the semiconductor substrate, having a plurality of column structures, of a second type of conductivity, to define a charge balancing region and also comprising an active surface layer for housing a plurality of active regions.

An embodiment of the invention is also a process for manufacturing such a semiconductor structure.

An embodiment of the invention particularly, but not exclusively, concerns a semiconductor structure for making a multi-drain power MOS device and the following description is made with reference to this field of application with the sole purpose of simplifying its explanation.

BACKGROUND

As well known, in recent years various solutions have been developed and proposed for improving the performance of multi-drain power MOS devices.

It is possible to obtain power MOS devices with low output resistor (Ron or "on" resistor), low capacitances associated with the structure of the power device, and a high breakdown voltage by modifying the charge concentration of the common drain layer.

For example, U.S. Pat. No. 6,228,719, U.S. Pat. No. 6,300,171, U.S. Pat. No. 6,404,010, U.S. Pat. No. 6,586,798, and U.S. Pat. No. 7,498,619 which are incorporated by reference, describe Multi-drain power MOS devices that comprise a common drain layer with adjustable charge concentration.

Such a multi-drain power MOS device is schematically illustrated in FIG. 1 and is made in a die of semiconductor material that substantially comprises an active surface area 5, where the MOS transistors 7 of the device are made.

Even more specifically, the power MOS device 1 comprises a semiconductor substrate 2, heavily doped with a first type of conductivity, for example N+, on which a semiconductor epitaxial layer 3 of the same first type of conductivity N is formed.

In the epitaxial layer 3 there are respective body regions 4, of a second type of conductivity, opposite to the first type of conductivity, of P type, for each MOS transistor 7, of the power MOS device 1. Within each body region 4 there are source areas 6, heavily doped with the first type of conductivity, of N+ type and gate regions 9 are thus made above the epitaxial layer 3 to define the single MOS transistors 7 that are completed with suitable metallization layers, not indicated in the figures.

The power MOS device 1 has the charge-balancing multi-drain epitaxial layer 3, which is made through a plurality of columns 8, of the second type of conductivity, of P type, which below each body region 4 extend, in depth in the epitaxial layer 3, towards the substrate 2.

A substantial charge equilibrium in the common drain layer allows high breakdown voltages to be obtained, whereas the high charge concentration, taken on by the common drain layer, allows a low output resistance Ron to be obtained, substantially improving the conduction performance with low losses even at high switching frequencies.

In order to make the columns 8, a sequence of steps is foreseen for the formation of overlying layers. Each step comprises the formation of an epitaxial layer with a concentration of doping substance followed by an implantation of doping substance with opposite conductivity, thanks to suitable masking. The overlying implanted regions undergo a subsequent diffusion process of the doping atoms, so as to make the individual columns 8. Such columns 8 are substantially uniform and have a constant charge concentration along the entire extension of the column 8.

At the upper portion of the epitaxial layer and using a mask with openings aligned with the columns 8, an implantation of doping substance is carried out to make the body regions 4 to obtain the required coupling.

In this way, each column 8 is aligned and in contact with a respective body region 4 for each MOS transistor 7 of the power MOS device 1. The columns 8 and the body regions 4 thus occur with the same frequency in the active area 5 of the die.

It is noted that the presence of the columns 8 allows the resistivity of the epitaxial layer 3 to be reduced without decreasing the breakdown voltage of the power MOS device 1, which, as a whole, is substantially linked to the height of the columns 8 in the column region. With this type of power device, it is thus possible to reach a predetermined breakdown voltage with a lower resistivity of the epitaxial layer 3 than that used in conventional power devices, and, consequently, to obtain power devices with low output resistance.

On the other hand, the increasing need to miniaturize power devices has led to the solution of increasing the density of the elementary components that form the power device itself.

A known solution for increasing the density of the elementary components and minimizing the conduction leakages provides for increasing the number of layers that make up the epitaxial layer and the relative implantation steps in order to ensure a good consistency of the electric field during the operation of the power MOS devices.

A further solution is described in the European patent application published with No. EP 1911075, which is incorporated by reference, and which discloses making first and second columns having elementary structures of substantially "elliptical" shape and with opposite conductivity in the epitaxial layer.

Making a power MOS device with high packing factor of the transistors has the consequence of decreasing the distance between the columns in the epitaxial layer, as well as increasing the gate charge per unit surface of the power MOS device itself, since the area occupied by the gate regions of each transistor located in it is reduced.

Furthermore, the increased packing factor causes an increase in the intrinsic capacitances of the power MOS device. This means a substantial worsening of the conduction performance of the power MOS device that becomes more evident during operation with high switching frequencies.

It is also known that the power device integrated in the die comprises an edge area that surrounds the perimeter of the active area, intended to house an edge structure or circuitry.

The edge structure, as illustrated in FIG. 2, substantially comprises a ring-shaped region 11 that completely surrounds the active area and has an overlaying area with a peripheral part of the active area, forming a ring around it.

In particular, as illustrated in FIG. 3, according to the current design rules, the number of columns 12 applied in the ring-shaped region 11 is determined by the size of the ring-shaped region 11 and by the pitch value that is a value linked to the size of and the distance between the columns 8 present in active area of the die and thus linked to the periodicity of the body regions 4.

SUMMARY

An embodiment of the present invention is a semiconductor structure for making a power device integrated on a semiconductor substrate, having such structural and functional characteristics as to obtain a highly integrated power device, with low output resistance, small dimensions and with improved performance at high switching, thus overcoming the limits and the drawbacks still affecting the semiconductor structures and the power devices integrated in it made according to the prior art.

An embodiment of the present invention is a semiconductor structure with an epitaxial layer having the column structures for balancing charge with periodicity unconstrained by the dimensions of the active components that can be made in the semiconductor structure.

An embodiment of the invention is a semiconductor structure for a power device integrated on a semiconductor substrate, of a first type of conductivity, and comprising an epitaxial layer, of said first type of conductivity, made on said semiconductor substrate and having a plurality of column structures, of a second type of conductivity, to define a charge balancing region; an active surface layer made on said epitaxial layer for housing a plurality of active regions; wherein said epitaxial layer comprises a semiconductor separating layer arranged between said charge balancing region and said active surface layer, said semiconductor separating layer decoupling said column structures from said active regions.

According to an embodiment of the present invention, the separating layer is a portion of said epitaxial layer and it has the same type of conductivity.

According to a further embodiment of the present invention, the separating layer has the same type of conductivity as the type of conductivity of one of said active regions.

The column structures may extend along the thickness of said epitaxial layer in the direction of said substrate parallel to one another and to an axis of said semiconductor structure.

Moreover, the column structures may extend in strips, parallel to one another, with extension in depth of said epitaxial layer and they may be arranged, in a plan view, according to a direction β that forms an angle α with a third axis Z of said semiconductor structure, said angle α being between approximately 0° and 180°.

The active surface layer may comprise a first portion suitable for containing first active regions and a second portion suitable for at least partially surrounding said first portion and for containing second active regions, and in that said column structures contained in said epitaxial layer underneath said first portion may extend to occupy the area underneath said second portion without points of discontinuity.

The charge balancing region may comprise a further plurality of column structures, of said first type of conductivity, substantially alternating with said plurality of column structures.

In an embodiment a semiconductor power device integrated on a semiconductor layer and comprising at least one first active portion made above said semiconductor layer, which may comprise a semiconductor structure of the type described above.

Furthermore, an embodiment of a process for manufacturing a semiconductor structure for a power device comprises the steps of:
 making a semiconductor substrate doped with a first type of conductivity;
 making an epitaxial layer of said first type of conductivity on said semiconductor substrate;
 making a plurality of column structures of a second type of conductivity in said epitaxial layer to define a charge balancing region;
 making an active surface layer, of said first type of conductivity, suitable for housing a plurality of active regions above said charge balancing layer; and
 making a semiconductor separating layer arranged between said charge balancing region and said active surface layer so as to decouple said column structures from said active regions.

According to an embodiment of the present invention, the process provides for making said separating layer with epitaxial growth of said epitaxial layer, said column structures being embedded in said epitaxial layer.

An embodiment also provides for making said separating layer with the same type of conductivity as the type of conductivity of one of said active regions.

According to a further embodiment of the present invention, each of said column structures is made with an extension along the thickness of said epitaxial layer parallel to a first axis Y of said semiconductor structure and said column structures extend in strips with extension in depth of said epitaxial layer, said strips being parallel to one another and arranged according to a direction β that defines an angle α with respect to a third axis Z of said semiconductor structure, said angle α being between approximately 0° and 180°.

In an embodiment, a first portion and a second portion suitable for at least partially surrounding said first portion is defined in said active surface layer, and the manufacturing process provides for making said column structures in said epitaxial layer underneath said first portion and extending said column structures to occupy at least one part of said epitaxial layer underneath said second portion without points of discontinuity.

An embodiment of the manufacturing process provides for making a further plurality of column structures, of the first conductivity, in the charge balancing region substantially alternating with the plurality of column structures.

In an embodiment, a wafer for integrating semiconductor devices comprises at least one portion made according to an embodiment of manufacturing process of the type indicated above as well as a wafer for integrating semiconductor devices the wafer made from a semiconductor structure of the type described above.

BRIEF DESCRIPTION OF THE DRAWINGS

Features and advantages of the semiconductor structure and of the manufacturing process according to one or more embodiments of the invention will be apparent from the following description of an embodiment thereof, given by way of non-limiting example with reference to the attached drawings.

In such drawings:

FIGS. 10-13 are schematic section views of four different embodiments of a power device, in particular relative to an edge termination structure and integrated in a semiconductor structure;

FIGS. 14-17 are schematic views from above of portions of power devices integrated in a semiconductor structure made according to embodiments, with the views omitting some layers to highlight the certain characteristics.

DETAILED DESCRIPTION

Figure 1:
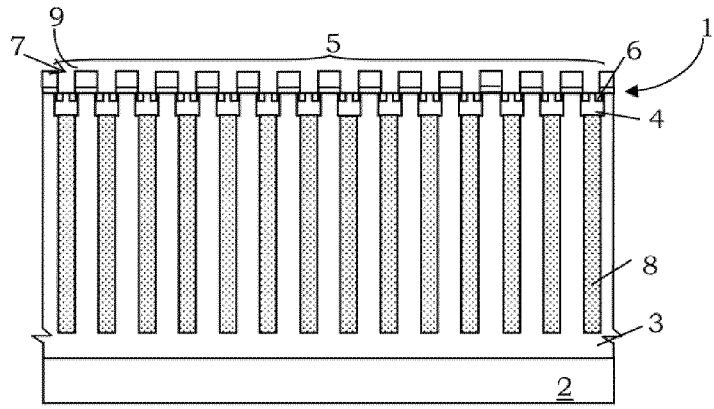
FIG. 1 is a schematic section view of a portion of a multi-drain power MOS device made according to the prior art.
Figure 2:
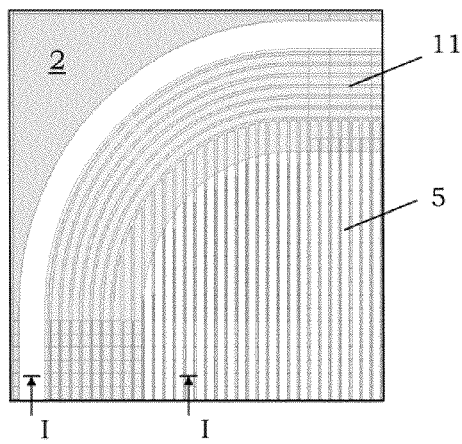
FIG. 2 is a schematic view from above of a portion of the power device of FIG. 1, in particular relative to an edge termination structure.
Figure 3:
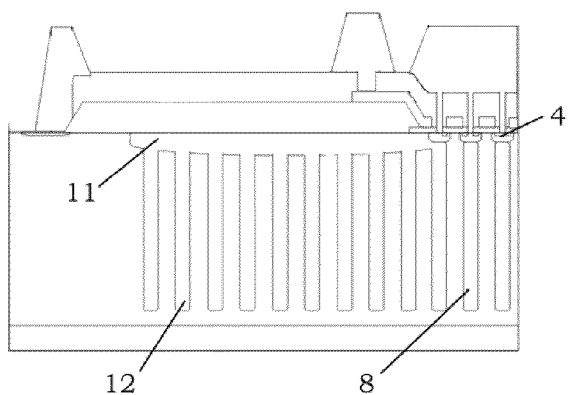
FIG. 3 shows a schematic section view of the power device of FIG. 2 according to a section line I-I.
Figure 4:
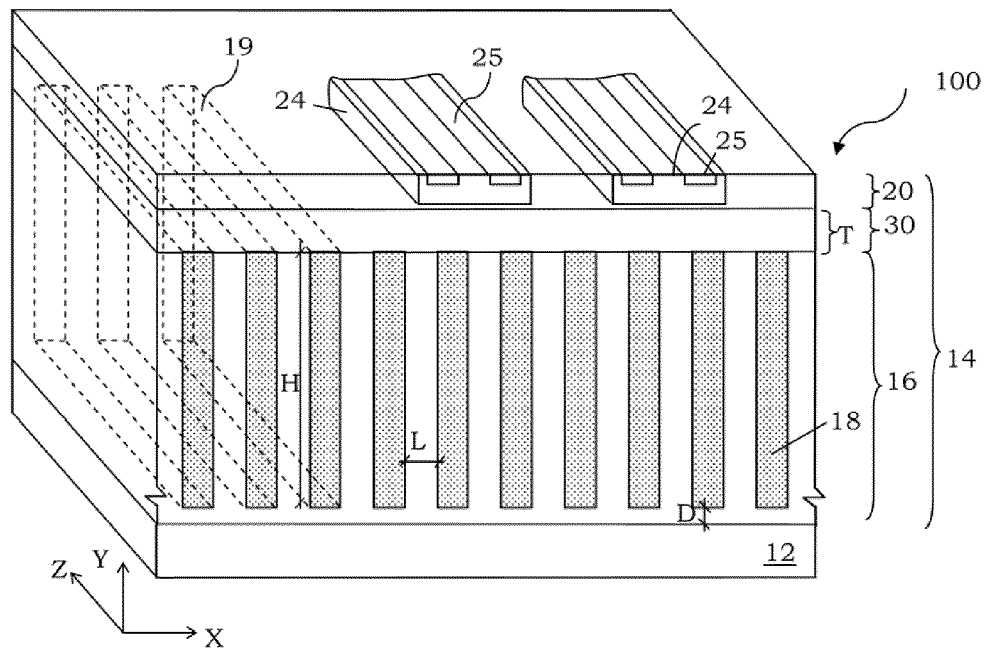
FIG. 4 is a schematic section view of a portion of a semiconductor structure, made according to a first embodiment.

With reference to such figures and in particular to FIG. 4, a semiconductor structure made according to an embodiment is wholly and schematically indicated with 100.

The semiconductor structure 100 is used to integrate a power device 10, like for example a vertical conduction multi-drain MOSFET device, a BJT device or else a diode or other similar devices, as shall be described in the rest of the description.

It is noted that the figures that represent schematic views of portions of power devices and of a semiconductor structure are not drawn to scale, but instead are drawn so as to emphasise certain features.

The semiconductor structure 100 is integrated on a semiconductor substrate 12 of a first type of conductivity and heavily doped, in the example of the N+ type.

The semiconductor structure 100 also comprises an epitaxial layer 14 made on the semiconductor substrate 12 and having the same first type of conductivity, in particular of N type.

In the epitaxial layer 14 a plurality of column structures 18 are made suitably doped with charges having a second type of conductivity, opposite to the first type of conductivity, in the present case of P type, so as to define a charge-balancing region 16 in the epitaxial layer 14.

The column structures 18 extend along the epitaxial layer 14 towards the underlying semiconductor substrate 12 parallel to a first axis Y of the semiconductor structure 100. According to the embodiment illustrated in FIG. 4, the column structures 18 are spaced from the semiconductor substrate 12 by substantially the same thickness D of epitaxial layer 14, periodically repeating along a second axis X of the semiconductor structure 100, at a substantially separation distance L.

Moreover, such column structures 18 extend in strips 19 with extension in depth of the epitaxial layer 14. Such strips 19 are substantially parallel to one another and arranged substantially parallel to a third axis Z of the semiconductor structure 100.

The semiconductor structure 100 also comprises an active surface layer 20, of a first type of conductivity, above the charge-balancing region 16, suitable for housing suitably doped active regions 24, 25 of the power device 10 that will be integrated in it.

According to an embodiment, the semiconductor structure 100 comprises a semiconductor separating layer 30 arranged between the charge-balancing region 16 and the active surface layer 20.

According to a further embodiment, the separating layer 30 is a portion of the epitaxial layer 14. In this way, the column structures 18 remain totally embedded in the epitaxial layer 14.

According to an embodiment, the separating layer 30 has the same type of conductivity as the type of conductivity of the epitaxial layer 14 and in any case the conductivity is such as not to hinder the formation of a substantially vertical conductive path from the active regions 24, 25 of the active surface layer 20 to the semiconductor substrate 12 below. In some embodiments, the conductivity of the separating layer 30 is the same as that of one of said active regions, for example the source area 24, to ensure the passage of current from such an active region, made in the active surface layer 20, to the charge-balancing region 16 towards the semiconductor substrate 12.

According to an embodiment, the epitaxial layer 14 of the semiconductor structure 100 is approximately completed by the separating layer 30, which has predetermined dimensions, in particular substantially a thickness T, as well as characteristics of conductivity and therefore resistivity such as to allow the passage of current through the underlying charge-balancing region 16 towards the semiconductor substrate 12.

In particular, the separating layer 30 has the thickness value T that varies inversely to its resistivity. Even more specifically, the thickness T has a value between the thickness of at least one of the active regions 24, 25, able to be made in the active surface layer 20 and the height value H of the column structures 18.

According to an embodiment, the separating layer 30 has a charge concentration such as to reduce or minimize the voltage drop BV and reduce the impact upon the output resistance Ron of the semiconductor structure 100 as well as of the power device 10 that will be integrated in it.

In other words, the dimensional and resistivity characteristics of the separating layer 30 may be selected so that near to the interface between the separating layer 30 and the charge-balancing region 16 an acceptable electric field value is obtained, the value of such a field of course depending on the power device 10 that will be integrated.

According to an embodiment, due to the presence of the separating layer 30, the column structures 18 have arrangements and dimensions that are able to be decoupled, i.e., independent, from the dimensions of the active regions 24, 25, which may be made in the active surface layer 20.

According to another embodiment, with the separating layer 30 present over substantially the entire semiconductor structure 100 and with the charge-balancing region 16 present substantially uniformly over the entire area of the epitaxial layer 14, the column structures 18 are continuous and, in particular, do not have points of discontinuity.

Therefore, the column structures 18 may have dimensions, periodicity, as well as conductivity exclusively linked to the design requirements of the power device 10 to be integrated in said semiconductor structure 100.

There are numerous embodiments all covered by the same general concept.

In the following description we will refer to the semiconductor structure described earlier and details and cooperating parts having the same structure and function shall be indicated with the same reference numerals and symbols.

Figure 5:
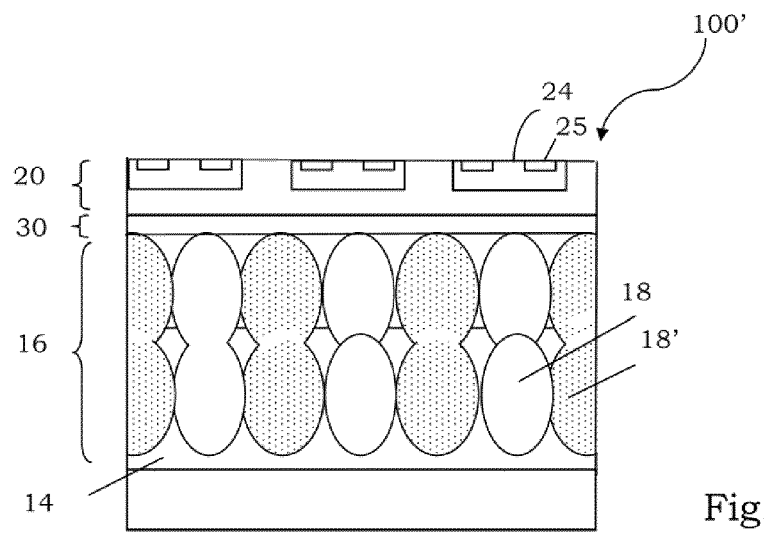
FIG. 5 is a schematic section view of a portion of a semiconductor structure, made according to a second embodiment.

FIG. 5 illustrates an embodiment of a semiconductor structure 100' comprising an epitaxial layer 14 integrated on a semiconductor substrate 12 and having a charge-balancing region 16.

In an embodiment, the charge-balancing region 16 comprises a plurality of column structures 18 and a further plurality of column structures 18' substantially alternating with each other and respectively doped with charges having opposite conductivity to allow better control of the balancing of charge inside the epitaxial layer 14.

According to an embodiment, the epitaxial layer 14 comprises a semiconductor separating layer 30 arranged between the active surface layer 20 and the charge-balancing region 16.

The separating layer 30 allows the configuration and in particular the periodicity of the column structures 18 in the charge-balancing region 16 to be decoupled from the configuration and in particular from the periodicity of the active regions 24, 25 able to be made in the active surface layer 20. This allows many objectives to be achieved: a high packing factor of the active regions 24, 25, able to be made in the active surface layer 20 and a better control of the charges inside the epitaxial layer 14.

Hereafter, we shall illustrate different embodiments of power devices that comprise a semiconductor structure previously described for which details and cooperating parts having the same structure and function will be indicated with the same reference numerals and symbols.

Each device described hereafter could be made without distinction with a semiconductor structure according to the embodiments illustrated in FIG. 4 or 5 or else a combination thereof.

Figure 6:
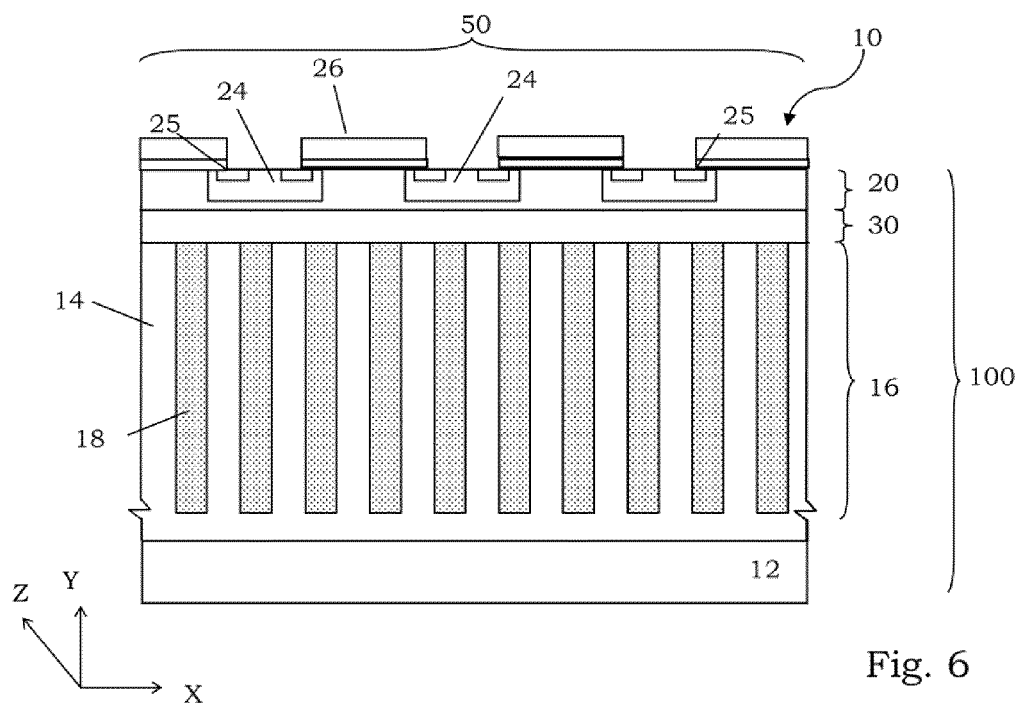
FIG. 6 is a schematic section view of a portion of a first power device integrated in the semiconductor structure illustrated in FIG. 4.

In the example of FIG. 6 a power device 10, in particular an MOS device, integrated in a semiconductor structure 100, according to an embodiment and of the type described earlier with reference to FIG. 4, is schematically illustrated.

In particular, FIG. 6 illustrates an active portion 50 of the vertical conduction multi-drain power MOS device 10 in which a plurality of elementary active components, such as MOS transistors, are made.

The semiconductor structure 100 comprises an epitaxial layer 14 of a first type of conductivity, of N type, made on a semiconductor substrate 12 and having a charge-balancing region 16 comprising a plurality of column structures 18. The semiconductor structure 100 comprises a separating layer 30 made above the charge-balancing region 16 with an active surface layer 20 on top in which a plurality of active regions are made.

The active areas made in the active surface layer 20 are body regions 24, of the second type of conductivity, of P type, inside of which corresponding plurality of source areas 25, of the first type of conductivity, of N type, are made.

A plurality of gate structures 26, made between consecutive pairs of body regions 24, on a channel region defined in the active surface layer 20 between the body regions 24, and in contact with the source areas 25 complete the plurality of MOS transistors of the power device 10. Finally, suitable metallizations made in the conventional manner and suitable contacts for the single MOS transistors complete the active portion 50 of the power device 10.

Due to the presence of the separating layer 30, in the semiconductor structure 100, the column structures 18 are decoupled from the body regions 24 and in particular they have different periodicity. Moreover, the power MOS device 10 thus obtained has the multi-drain semiconductor structure 100 decoupled from the gate structure 26, in this way allowing the semiconductor structure 100 to be made with its own characteristics no longer linked to the periodicity of the elementary elements that can be integrated in it, in this way improving the performance of the power MOS device 10.

Figure 7:
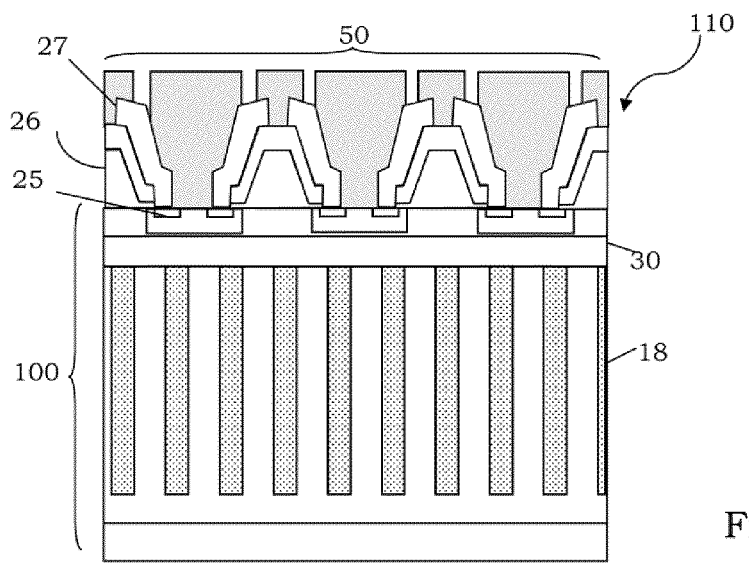
FIG. 7 is a schematic section view of a portion of a second power device integrated in the semiconductor structure illustrated in FIG. 4.

In the example of FIG. 7 a second embodiment of a power device 110 integrated in a semiconductor structure 100 made according to embodiments is illustrated. Such an example illustrates an active portion 50 of a multi-drain power MOS-FET device for radio frequency or RF applications.

The power device 110 for RF applications as known has high gate oxide thicknesses at each gate structure 26 of each MOS transistor and also has suitable bridges 27 suitable for making contact with the gate structure 26 and the corresponding source areas 25 of each MOS transistor.

Due to the semiconductor structure 100, according to an embodiment and in particular to the presence of the separating layer 30, the power device 110 for RF applications has the column structures 18 of the charge-balancing region 16 decoupled from the dimensions and the periodicity of the source areas 25 and thus of the respective gate structures 26. This allows, in particular, dimensions and periodicity of the column structures 18 and of the gate structures 26 to be separately optimized to significantly improve the performance and the switching efficiency of the power device 110 for RF applications.

Figure 8:
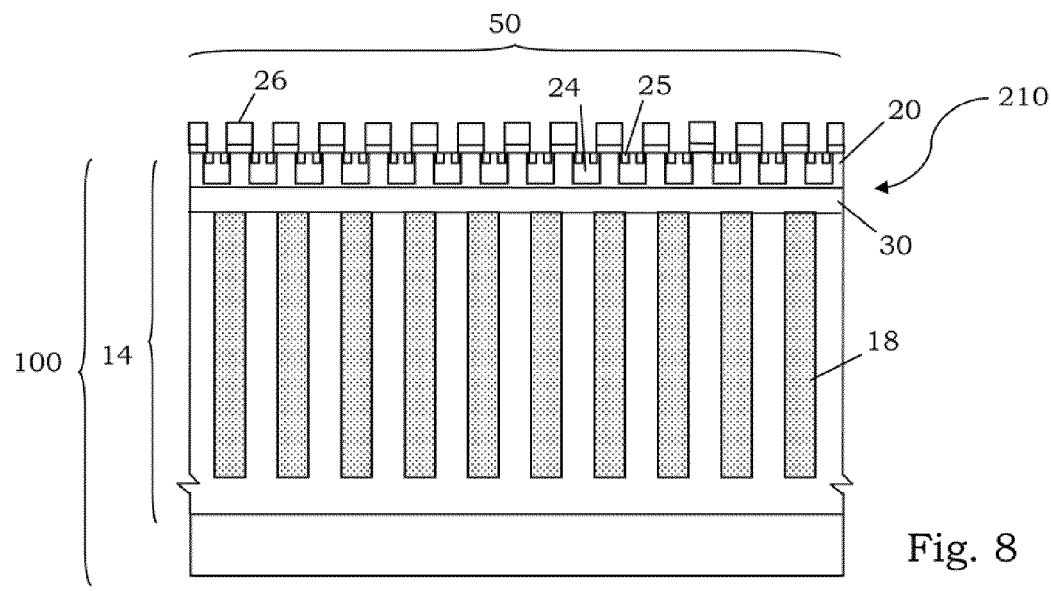
FIG. 8 is a schematic section view of a portion of a third power device, integrated in the semiconductor structure illustrated in FIG. 4.

The example of FIG. 8 schematically illustrates a third embodiment of an active portion 250 of a power device 210 integrated in a semiconductor structure 100.

The power device 210 substantially has body regions 24 and respective source areas 25, contained in the active surface layer 20 of the semiconductor structure 100.

The epitaxial layer 14 of the semiconductor structure 100 comprises the separating layer 30 on the charge-balancing region 16 with column structures 18.

In particular, the power device 210 according to an embodiment comprises gate structures 26 that have smaller dimensions and higher periodicity than the dimensions and periodicity of the column structures 18.

Indeed, due to the presence of the separating layer 30 it is possible to decouple the layout of the body regions 24 and thus of the corresponding gate structures 26 from the layout of the column structures 18 that can respectively be made by optimizing these single features.

Moreover, such a power device 210 allows a channel to be obtained between the body regions 24, the dimensions of which are decoupled from the dimensions of the column structures 18, which instead may be conditioned by technological limitations. In particular, the channel may have a greater perimeter than the channel perimeter of devices made according to the prior art also with a reduction of conduction leakages.

Figure 9:
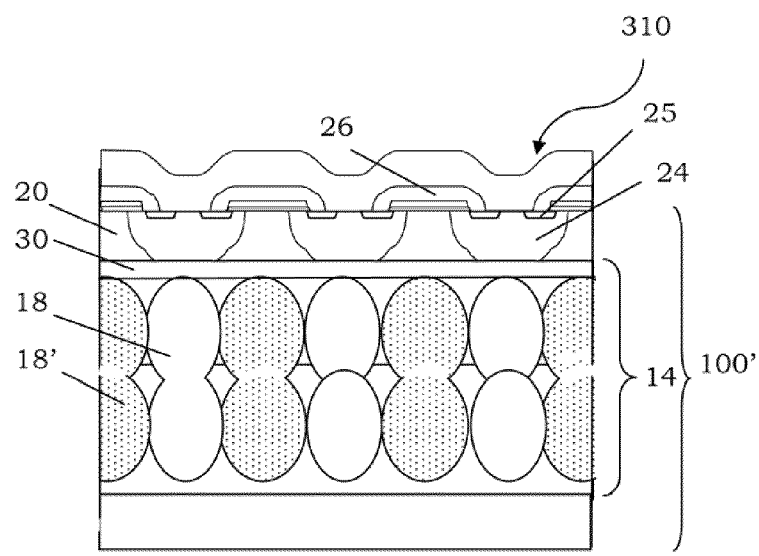
FIG. 9 is a schematic section view of a portion of a power device, integrated in the semiconductor structure illustrated in FIG. 5.

A further embodiment of a power device 310 integrated in a semiconductor structure 100' is illustrated in FIG. 9. According to such an embodiment, the epitaxial layer 14 of the semiconductor structure 100' comprises a separating layer 30 on a charge-balancing region 16 having a plurality of column structures 18 and a further plurality of column structures 18'.

An embodiment allows high thicknesses of the epitaxial layer 14 to be associated with a high packing factor of the plurality of elementary active components able to be integrated at the active surface layer 20, amplifying the individual advantages.

Figure 10:
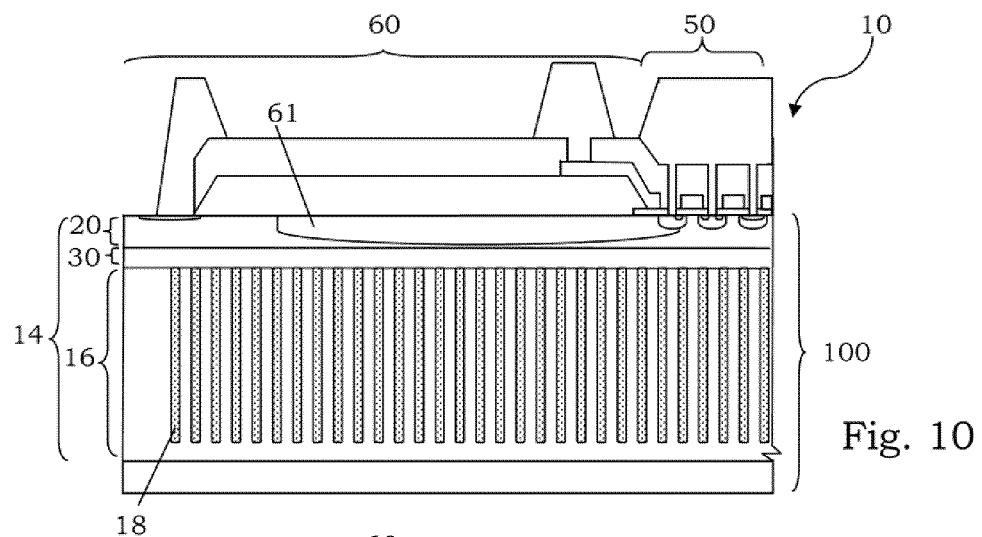

According to a further embodiment, a semiconductor structure 100, 100' allows the integration of the active portion 50 of a power device as well as of a corresponding perimeter edge termination structure 60 (FIG. 10).

The semiconductor structure 100 comprises column structures 18 substantially uniformly present and distributed substantially parallel to one another, with substantially equal spacing and dimensions, i.e., with substantially the same pitch value, over substantially the entire area of the epitaxial layer 14.

The example of FIG. 10 schematically illustrates a power device 10, substantially made with an active portion 50, similar to the one represented in FIG. 6 and described earlier, surrounded at the perimeter by an edge termination structure 60.

The edge termination structure 60 substantially comprises a ring-shaped region 61 suitably doped at low concentration, in the present case of P type, formed in the active surface layer 20 of the semiconductor structure 100. The ring-shaped region 61 completely surrounds the active portion 50 and has an overlying area with a peripheral part of the active portion 50, suitable for containing suitable edge terminations.

Due to the semiconductor structure 100, according to an embodiment, and in particular to the presence of the separating layer 30, the column structures 18 of the charge-balancing region 16 are decoupled from the dimensions but above all from the configuration of the ring-shaped region 61. This allows the semiconductor structure 100 and in particular the charge-balancing region 16 to be made for a substantial equilibrium of charge of the epitaxial layer 14 without being influenced or constrained by the dimensions of the edge termination structure 60 or by the packing factor of the elementary active components that can be made in the active surface layer 20.

Moreover, the single and substantially uniform semiconductor structure 100 for substantially the entire power device 10 may make it possible to avoid the formation of intersection points between the column structures 18 made beneath the active portion 50 and the column structures made beneath the edge termination structure 60. This, in particular, may avoid the formation of curved portions of the column structures 18, at the ring-shaped region 61, and thus the formation of points of discontinuity, as well as local charge excesses and phenomena of premature breakdown of the power device 10 obtained.

Figure 11:
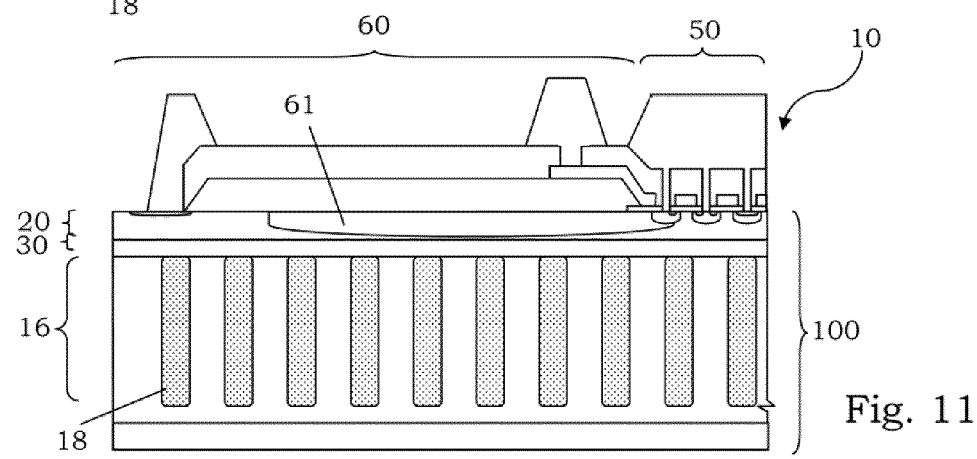

In the example of FIG. 11 an embodiment of the power device described above with reference to FIG. 10 is described.

In particular, the semiconductor structure 100, due to the presence of the separating layer 30, comprises a charge-balancing region 16 with column structures 18 that have greater dimensions and periodicity than the dimensions and periodicity of the column structures 18 of the embodiment of FIG. 10.

This may allow the charge-balancing region 16 of the epitaxial layer 14 to be made according to specific design requirements without being influenced by the dimensions of the ring-shaped region 61 or of the active regions present at the first portion 50 of the device.

Figure 12:
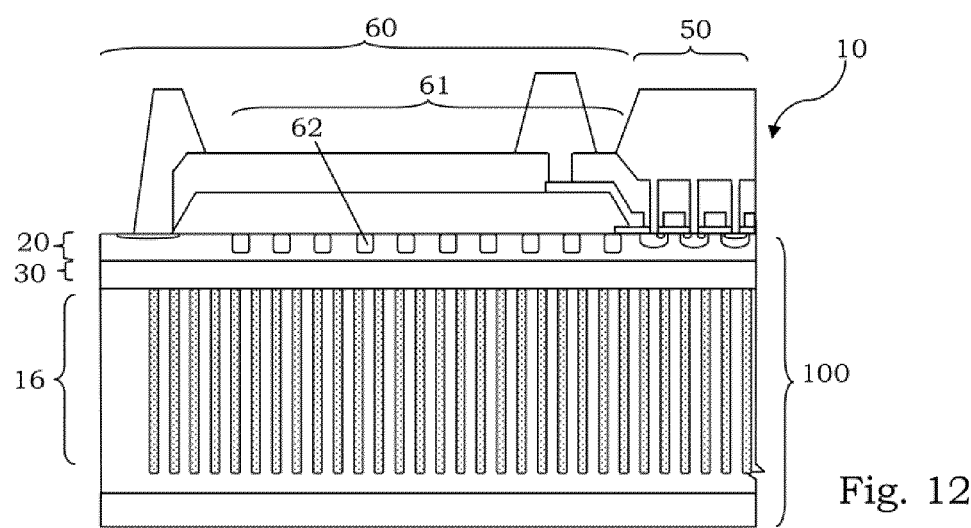

FIG. 12 illustrates a further embodiment of a power device 10 integrated on a semiconductor structure 100.

According to such an embodiment, the edge termination structure 60, made in the active surface layer 20 of the semiconductor structure 100, has a ring-shaped region 61 that comprises a series of rings 62, substantially concentric, which surround the perimeter of the active portion 50 of the power device 10.

The separating layer 30 contained in the semiconductor structure 100 allows dimensions and periodicity of the column structures 18 to be decoupled from the dimensions and periodicity of the series of rings 62 of the ring-shaped region 61.

A further embodiment of a power device 10 is illustrated in FIG. 13.

According to such an embodiment, the power device 10 is integrated in a semiconductor structure 100 that has a charge-balancing region 16 having the column structures 18 made with greater dimensions than the dimensions of the series of rings 62 and of the elementary components made at the active surface layer 20.

In particular, the semiconductor structure 100 may allow the performance of the power devices in direct and reverse bias and also in switching to be optimized, improving the reliability thereof with a substantial consequent improvement of industrialization.

Of course, it is possible to bring modifications and variants to what has been described without for this reason departing from the scope of protection of the present disclosure.

According to a further embodiment, the semiconductor structure 100 could have the column structures 18 that, extending in the thickness along the first axis Y of the epitaxial layer 12, reach the semiconductor substrate 12 beneath.

Moreover, FIGS. 14 and 15 illustrate two further embodiments of a power device integrated in a semiconductor structure 100. For the sake of greater visual clarity, FIGS. 14 and 15 present schematic plan views of the power device and comprise the column structures 18 (shown with full strips) and the gate structures or strips 26 (shown with dashed strips). The gate strips 26 are arranged substantially parallel to one another and as known arranged according to the third axis Z of the semiconductor structure 100, made according to FIG. 4.

In particular, in the example illustrated in FIG. 14, the column structures 18 extend in depth of the epitaxial layer 14, in strips 19 that in plan are arranged substantially parallel to one another and according to a direction β that defines an angle α with respect to the third axis Z of the semiconductor structure 100 and thus with respect to the gate strips 26. The angle α takes on a value of approximately between 0° and 180°.

In the example of FIG. 15 a power device integrated in a semiconductor structure 100 is illustrated that has the strips 19 of the column structures 18 that in plan are arranged according to a direction β that forms an angle α of 90° with respect to the third axis Z of the semiconductor structure 100. In such an example, the column structures 18 are thus arranged perpendicular to the gate structures or strips 26 of the power device.

The aforementioned alternative solutions may allow substantial margins of freedom to be offered in the layout of the power device integrated on a semiconductor structure, and indeed the presence of the separating layer may make it possible to optimize dimensions, spacing and spatial arrangements of the column structures 18 both at the active area and at the edge termination structure.

According to another embodiment, it is possible to make power devices, integrated in a semiconductor structure 100, with a plurality of elementary active components that have a cell-type layout that is different than the prior art, as for example illustrated in FIGS. 16 and 17.

The example of FIG. 16 illustrates a power device 410 with elementary components 411 that have gate regions and substantially gate areas 426 with hexagonal configuration that in plan define a honeycomb shape. In such an embodiment, moreover, each of the elementary components 411, at the center of each gate area 426, comprises a source contact area 428 substantially with a circular configuration and a source area 429 coming into contact with the source contact area 428. Such an embodiment in particular allows the channel area that substantially surrounds the perimeter of each source area 429 to be increased per unit area of the power device for the same typical photo exposure dimensions (also called feature size). The example of FIG. 17 illustrates a further power device 510 with elementary components 511 that have substantially square gate structures 526, which in plan define a reticular configuration. Each of the elementary components 511, at the center of each square, comprises a source contact area 528, with a substantially rectangular configuration.

The configuration and dimensions of the source contact area 428 and 528, as well as the gate areas 426 and 526 and the underlying gate regions may be different according to the specific design requirements.

Therefore due to the presence of the separating layer 30, it may be possible to optimize the dimensions of the elementary active components that can have different individual configurations to those of the prior art.

Moreover, for the same dimensions typical of photo-exposure, also known by the term "feature size", it may be possible to obtain elementary active components with a greater channel area per unit area of the power device. This may allow the extension of the power devices to be increased.

According to a further embodiment, it is possible to make wafer slices comprising at least one portion of said semiconductor structure 100, 100' and to make such wafer slices as semi-worked product to be used in a production line to integrate any microelectronic power device.

Moreover, according to a further embodiment, it is possible to make multi-drain wafer slices as semi-worked products grouped in different voltage classes, based on the thickness of the epitaxial layer 14, and differentiated by conduction potential, based on the pitch value of the pluralities of column structures 18 made in the epitaxial layer 14.

An embodiment also refers to a process for manufacturing a semiconductor structure 100 of the type described earlier for which details and cooperating parts having the same structure and function shall be indicated with the same reference numerals and symbols.

The process steps described hereafter do not form a complete manufacturing process flow for semiconductor structures. An embodiment may be put into practice together with the manufacturing techniques currently used in the field and only the steps of the process that are deemed necessary for understanding are included in the description.

With reference in particular to FIG. 4, an embodiment of a manufacturing process essentially comprises the steps of:
making a semiconductor substrate 12 of a first type of conductivity heavily doped, for example of N+ type;
epitaxially growing an epitaxial layer 14 of the first type of conductivity N on such a semiconductor substrate 12; and
making a plurality of column structures 18 of a second type of conductivity, opposite to the first type of conductivity, in this case of P type, in said epitaxial layer 14 to define a charge balancing region 16.

According to an embodiment, the column structures 18 may be made through a sequence of implantation steps of a doping substance alternating with epitaxial growth to make the epitaxial layer 14 and subsequent thermal diffusion step.

According to an embodiment, a manufacturing process comprises the step of:
making a semiconductor separating layer 30 and an active surface layer 20, through epitaxial growth of the epitaxial layer 14, above the charge-balancing region 16.

The active surface layer 20, of the first type of conductivity N, makes it possible to house a plurality of active regions 24, 25, suitably doped to define a plurality of elementary components as well as of active regions 61, 62, at the edge structure.

The semiconductor separating layer 30 is made with the same type of conductivity as the type of conductivity of the epitaxial layer 14 and in any case with a conductivity such as not to hinder the formation of a substantially vertical conductive path, from the active regions 24, 25 of the active surface layer 20 to the semiconductor substrate 12 beneath. In some embodiments, the separating layer 30 is made with the same type of conductivity as that of one of said active regions, for example of the source area 24, to ensure the passage of current from such an active region, made in the active surface layer 20, to the charge-balancing region 16 towards the semiconductor substrate 12 and at the same time to allow the column structures 18 to be decoupled from said active regions 24, 25, 61, 62.

A manufacturing process, according to an embodiment, provides for making each of the column structures 18 with an extension along the thickness of the epitaxial layer 14 parallel to one another and parallel to a first axis Y of the semiconductor structure 100 as well as extending such column structures 18 with an extension in depth of the epitaxial layer 14 to define strips 19 substantially parallel to one another.

The manufacturing process provides, in particular, for making the strips 19 of the column structures 18 substantially according to a direction β that defines an angle α with respect to a third axis Z of the semiconductor structure 100, as in particular illustrated in FIGS. 14 and 15. Such an angle α may be between approximately 0° and 180°.

According to another embodiment, the process provides substantially rectilinearly extending the column structures 18 to occupy substantially the entire area of the epitaxial layer 14.

According to a further embodiment, a process provides for making the separating layer 30 with a thickness T substantially between the thickness t1 of at least one of the active regions 24, 25, 61, 62, made in the active surface layer 20 and the height H of the column structures 18. According to an embodiment, as illustrated in FIG. 5, the process provides for making the charge-balancing region 16 by making first column structures 18 in the epitaxial layer 14 alternating with further column structures 18'. The further column structures 18' are obtained through simultaneous implantation of a second doping substance, in such an epitaxial layer 14, so as to obtain the charge balancing.

An embodiment of the process for making the semiconductor structure 100, 100' provides for making the epitaxial layer 14 through epitaxial growth of successive layers. In the epitaxial layer 14 thus obtained, such a process also provides the formation of suitable trenches and their epitaxial filling to respectively make the column structures 18 and possibly the further column structures 18'.

A subsequent epitaxial growth of the epitaxial layer 14 defines the separating layer 30 as well as the active surface layer 20.

According to a further embodiment, the semiconductor structure 100, 100' allows semi-worked tiles or dies to be obtained that are suitable for being integrated in order to obtain respective power devices.

Indeed, the separating layer 30 allows the dimensions of the column structures 18 to be decoupled from the dimensions of the active regions 24, 25, 61 and 62 that will be made at the active surface layer 20.

According to an embodiment, a sequence of steps, per se typical, for integrating a power device 10 may be carried out from a semiconductor structure 100 according to an embodiment.

According to an embodiment illustrated in FIG. 6, at the active surface layer 20, a plurality of body regions 24 and corresponding plurality of source areas 25 are made through predisposed masks and suitable doping.

On top of the active surface layer 20 and above a channel region defined between consecutive pairs of body regions 24, it is possible to make respective gate structures 26 as well as respective metallizations suitably shaped through predisposed masking steps.

Due to the presence of the separating layer 30 in the semiconductor structure 100, the step for making the gate structures 26 may use masks and use techniques suitable to the physical dimensions of the gate structures 26 to be made, according to specific requirements, irrespective of the dimensions or periodicity of the column structures 18 in the charge balancing region 16.

Moreover, the semiconductor structure 100 may make it possible to integrate the active portion 50 as well as the perimeter edge termination structure 60 suitable for containing the edge circuitry of the power device 10, as for example illustrated in FIG. 10.

An embodiment of the manufacturing process provides for making a ring-shaped region 61 at the same time as the body regions 24 are made or in a subsequent step.

Suitable metallizations for defining the predisposed edge circuitry, according to the design specifications, complete the process for making the power device 10.

As illustrated in FIGS. 16 and 17, power devices with gate areas 426, 526 respectively having alveolar or reticular configuration may be made from a semiconductor structure 100, 100' obtained according to an embodiment.

In particular, an embodiment of the process provides for making elementary components, 411 and 511 respectively, with gate areas 426 and 526 having hexagonal, square or other configuration according to the projected layout on top of the active surface layer 20, the elementary components being substantially independent from the dimensions and the periodicity of the column structures 18 in the charge-balancing region 16.

Figure 18:
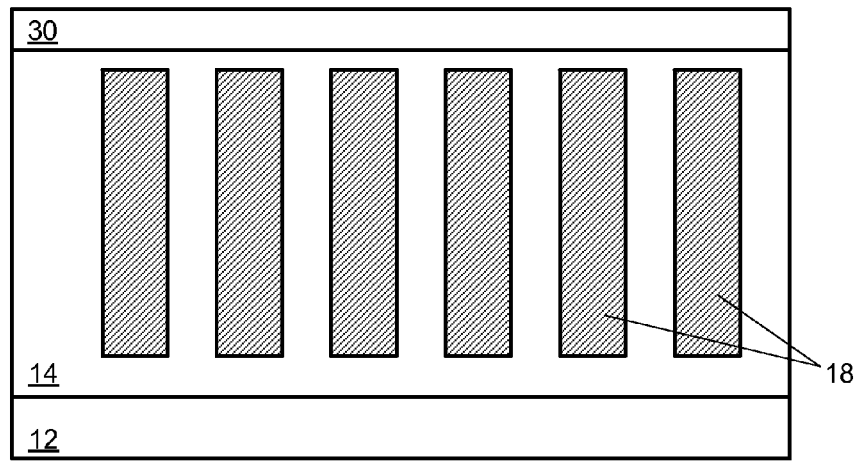
FIG. 18 depicts a portion of a power device, according to one embodiment.

FIG. 18 depicts a portion of a power device containing the charge-balancing region. According to one embodiment, the charge-balancing column structures 18 are spaced from the separating layer 30.

An advantage of an embodiment is that of obtaining a semiconductor structure with column structures decoupled, through the separating layer, from the active structures that may be made at or on top of the active surface layer, allowing each structure to be made so as to best provide the required features. This, in particular, makes it possible to make power devices with elementary components highly integrated in a semiconductor structure with column structures having low integration that substantially reduce the output resistance, obtaining an improvement during operation while switching.

Moreover, an embodiment of the semiconductor structure also makes it possible to make power devices with a high density of column structures that do not suffer from the technological limitations due to the increased density of the elementary components, for example due to the limitations linked to the photo-exposure resolution.

Another potential advantage is that of making a single and uniform semiconductor structure capable of integrating both an active portion of a possible power device and an edge termination structure, avoiding critical issues and points of discontinuity of the column structures, substantially improving the performance of the integrated power devices.

Another potential advantage is that of being able to make wafer slices, like multi-drain semiconductor structures, able to be used as a semi-worked product on a production line, onto which to integrate any microelectronic power device.

Another potential advantage of a process according to an embodiment is that of being able to be integrated in current units without particular additional production costs.

Another potential advantage is that the high-voltage power devices integrated in a semiconductor structure according to an embodiment have all of the advantages linked to the substantial balancing of charge in the common drain layer with a low output resistance Ron and low leakages even at high switching frequencies with a substantial increase in the packing factor of the elementary components.

Of course, one of skill in the art may bring numerous modifications and variants to the structure embodiments and to the process embodiments described above in order to satisfy contingent and specific requirements, all of which are covered by the scope of protection of the disclosure. In particular, it is possible by using a drain layer of P type and column structures of N type to obtain a dual-type high-voltage device structure.

And a device, such as a power MOS transistor, described above may be incorporated in a system that includes another component, such as a processor or other integrated circuit, coupled to the device.

Figure 19A:
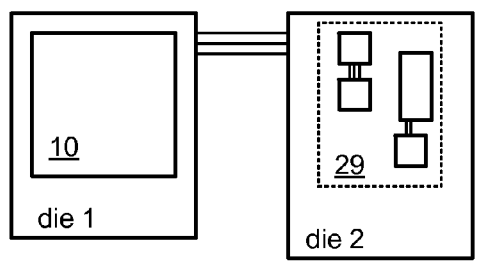
FIG. 19A depicts a power device on a first die coupled to an integrated circuit on a second die.
Figure 19B:
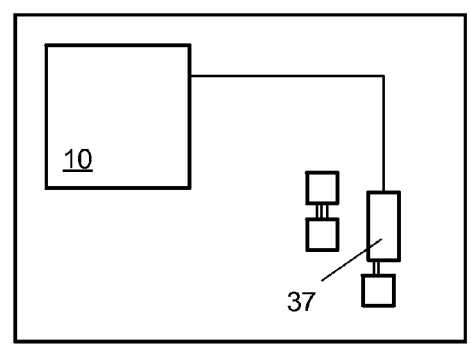
FIG. 19B depicts a power device coupled to a controller.

FIG. 19A depicts an embodiment in which a power device 10 located on a first die is coupled to an integrated circuit 29 located on a second die. FIG. 19B depicts an embodiment in which a power device 10 is coupled to a controller 37 of an integrated circuit.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A transistor, comprising:
a drain having a first conductivity;
a charge-balancing region disposed over the drain and having first charge-balancing structures of a second conductivity;
a buffer layer separately formed over the charge-balancing region and having the first conductivity;
a surface layer disposed over a first portion of the buffer layer and having the first conductivity;
body regions disposed in the surface layer to form an active region and having the second conductivity;

source regions disposed in the body regions and having the first conductivity;
gate regions disposed over the body regions; and
a ring-shaped region of the second conductivity formed in the surface layer in an edge-termination region of the transistor, wherein the ring-shaped region extends across a plurality of the first charge-balancing structures of the second conductivity.

2. A system, comprising:
a transistor, comprising:
  a drain having a first conductivity;
  a charge-balancing region disposed over the drain and having first charge-balancing structures of a second conductivity;
  a buffer layer separately formed over the charge-balancing region and having the first conductivity;
  a surface layer disposed over a first portion of the buffer layer and having the first conductivity;
  body regions disposed in the surface layer to form an active region and having the second conductivity;
  source regions disposed in the body regions and having the first conductivity;
  gate regions disposed over the body regions; and
  a continuous ring-shaped region of the second conductivity formed in the surface layer in an edge-termination region of the transistor, wherein the ring-shaped region extends across a plurality of the first charge-balancing structures of the second conductivity; and
an integrated circuit coupled to the transistor.

3. The system of claim 2 wherein the transistor and integrated circuit are disposed on a same integrated-circuit dies.

4. The system of claim 2 wherein the transistor and integrated circuit are disposed on respective integrated-circuit dies.

5. The system of claim 2 wherein the integrated circuit comprises a controller.

6. A semiconductor structure, comprising:
a substrate having a first conductivity;
a charge-balancing region disposed over the substrate and having first charge-balancing structures of a second conductivity;
a buffer layer formed over the charge-balancing region and having the first conductivity and excluding the first charge-balancing structures;
a surface layer disposed over a first portion of the buffer layer and having the first conductivity;
body regions disposed in the surface layer to form an active region and having the second conductivity;
source regions disposed in the body regions and having the first conductivity; and
an extended region of the second conductivity formed in the surface layer adjacent a body region, wherein the extended region extends across a plurality of the first charge-balancing structures of the second conductivity and has a lower surface bowing toward the buffer layer.

7. The semiconductor structure of claim 6 wherein the charge-balancing region has the first conductivity.

8. The semiconductor structure of claim 6 wherein the charge-balancing structures are adjacent to the buffer layer.

9. The semiconductor structure of claim 6 wherein the charge-balancing structures are spaced from the substrate.

10. The semiconductor structure of claim 6 wherein the charge-balancing structures are adjacent to the substrate.

11. The semiconductor structure of claim 6 wherein the charge-balancing structures are substantially uniformly spaced from one another.

12. The semiconductor structure of claim 6 wherein:
each of the charge-balancing structures has a thickness in a dimension substantially parallel to the substrate, a height in a dimension substantially normal to the substrate, and a length; and
the charge-balancing structures are substantially parallel to one another.

13. The semiconductor structure of claim 6 wherein:
each of the charge-balancing structures has a thickness in a dimension substantially parallel to the substrate, a height in a dimension substantially normal to the substrate, and a length that extends substantially in a direction; and
the body regions and source regions each have a length that extends substantially in the direction.

14. The semiconductor structure of claim 6 wherein each of the body regions has a thickness in a dimension substantially parallel to the substrate, a height in a dimension substantially normal to the substrate, and a length that is greater than the height and thickness.

15. The semiconductor structure of claim 6 wherein each of the source regions has a thickness in a dimension substantially parallel to the substrate, a height in a dimension substantially normal to the substrate, and a length that is greater than the height and thickness.

16. The semiconductor structure of claim 6, further comprising:
a first epitaxial layer disposed over the substrate;
a second epitaxial layer disposed over the first epitaxial layer;
a third epitaxial layer disposed over the second epitaxial layer;
wherein the charge-balancing region is disposed in the first epitaxial layer; wherein the buffer layer is disposed in the second epitaxial layer; and wherein the third epitaxial layer comprises the surface layer.

17. The semiconductor structure of claim 6, further comprising:
an epitaxial layer disposed over the substrate;
wherein the charge-balancing region is disposed in a first region of the epitaxial layer; wherein the buffer layer is disposed in a second region of the epitaxial layer; and wherein the active region is disposed in a third region of the epitaxial layer.

18. The semiconductor structure of claim 6, further comprising a termination region disposed over a second portion of the buffer layer.

19. The semiconductor structure of claim 6 wherein:
the first charge-balancing structures are spaced from one another by substantially a first distance; and
the body regions are spaced from one another by substantially a second distance that is different than the first distance.

20. The semiconductor structure of claim 6, further comprising a gate regions disposed over the body regions.

21. The semiconductor structure of claim 6 wherein:
the first conductivity comprises N-type conductivity; and
the second conductivity comprises P-type conductivity.

22. The semiconductor structure of claim 6 wherein:
the first conductivity comprises P-type conductivity; and
the second conductivity comprises N-type conductivity.

23. The semiconductor structure of claim 6, wherein a periodicity of the body regions differs from a periodicity of the charge-balancing structures.

24. The semiconductor structure of claim 6, wherein the gate regions are not aligned to the charge-balancing structures.

25. The semiconductor structure of claim 6 wherein the charge-balancing structures are spaced from the buffer region.

26. The semiconductor structure of claim 6 wherein the charge-balancing structures extend into the substrate.

27. The semiconductor structure of claim 6 wherein:
- each of the charge-balancing structures has a thickness in a dimension substantially parallel to the substrate, a height in a dimension substantially normal to the substrate, and a length that extends substantially in a first direction; and
- the body regions and the source regions each have a length that extends substantially in a second direction that is substantially different than the first direction.

28. The semiconductor structure of claim 6 wherein each of the body regions and source regions has a substantially square cross section in a plane that is substantially parallel to the substrate.

29. The semiconductor structure of claim 6 wherein each of the body regions and source regions has a substantially hexagonal cross section in a plane that is substantially parallel to the substrate.

30. The semiconductor structure of claim 6 wherein the charge-balancing region has second charge-balancing structures of the first conductivity.

31. The semiconductor structure of claim 6, wherein the extended region surrounds the active region and contacts at least one body region.

32. The semiconductor structure of claim 31, wherein the lower surface of the extended region does not intersect the buffer layer.

* * * * *